United States Patent
Yoon et al.

(10) Patent No.: US 11,871,655 B2
(45) Date of Patent: Jan. 9, 2024

(54) ORGANIC ELECTROLUMINESCENT DEVICE AND MANUFACTURING METHOD THEREFOR

(71) Applicant: LG Chem, Ltd., Seoul (KR)

(72) Inventors: Seokhee Yoon, Daejeon (KR); Donggu Lee, Daejeon (KR); Hwakyung Kim, Daejeon (KR); Jae Hak Jeong, Daejeon (KR); Jiyeon Shin, Daejeon (KR); Daeho Kim, Daejeon (KR); Jaesoon Bae, Daejeon (KR); Jaechol Lee, Daejeon (KR)

(73) Assignee: LG Chem, Ltd.

( * ) Notice: Subject to any disclaimer, the term of this patent is extended or adjusted under 35 U.S.C. 154(b) by 698 days.

(21) Appl. No.: 16/096,488

(22) PCT Filed: May 10, 2017

(86) PCT No.: PCT/KR2017/004821
§ 371 (c)(1),
(2) Date: Oct. 25, 2018

(87) PCT Pub. No.: WO2017/196076
PCT Pub. Date: Nov. 16, 2017

(65) Prior Publication Data
US 2019/0157580 A1    May 23, 2019

(30) Foreign Application Priority Data
May 10, 2016   (KR) .................. 10-2016-0057050

(51) Int. Cl.
*H10K 85/30* (2023.01)
*H10K 50/00* (2023.01)
(Continued)

(52) U.S. Cl.
CPC ........... *H10K 85/371* (2023.02); *H10K 50/00* (2023.02); *H10K 71/00* (2023.02); *H10K 85/30* (2023.02);
(Continued)

(58) Field of Classification Search
CPC ... H01L 51/0083–0088; H01L 51/0091; H01L 51/0092; H01L 51/0077;
(Continued)

(56) References Cited

U.S. PATENT DOCUMENTS 5,247,226 A * 9/1993 Sato .................. H05B 33/14
313/504
8,753,987 B2   6/2014 Yukinobu et al.
(Continued)

FOREIGN PATENT DOCUMENTS

CN    104037347 A  *  9/2014
CN    104576955 A  *  4/2015
(Continued)

OTHER PUBLICATIONS

English translation of CN 104037347 A obtained from Espacenet. (Year: 2014).*
(Continued)

*Primary Examiner* — Dylan C Kershner
*Assistant Examiner* — Braelyn R Watson
(74) *Attorney, Agent, or Firm* — Lerner David LLP (57) ABSTRACT

The present specification relates to a coating composition for a hole injection or transporting layer or a charge generating layer of an organic electroluminescent device, the coating composition including: an organic metal complex including one or more of Group V, Group VI, and Group VII transition metals; an organic metal complex or metal salt including one or more of Group I, Group VIII, Group XI, and Group XII metals; and an organic solvent, and a method for manufac-
(Continued)

| 701 |
| 601 |
| 501 |
| 401 |
| 301 |
| 201 |
| 101 | turing an organic electroluminescent device and an organic electroluminescent device using the same.

16 Claims, 1 Drawing Sheet

(51) Int. Cl.
  *H10K 71/00*  (2023.01)
  *H10K 50/15*  (2023.01)
  *H10K 50/17*  (2023.01)
  *H10K 71/15*  (2023.01)
  *H10K 71/40*  (2023.01)
  *H10K 99/00*  (2023.01)
(52) U.S. Cl.
  CPC .............. *H10K 99/00* (2023.02); *H10K 50/15* (2023.02); *H10K 50/17* (2023.02); *H10K 71/15* (2023.02); *H10K 71/441* (2023.02)
(58) Field of Classification Search
  CPC ............ H01L 51/5072; H01L 51/5088; H01L 51/5092; H01L 51/5096; H01L 51/0051; H01L 51/0008; H01L 51/001; H01L 51/0003; H01L 51/0004; H01L 51/0005; H01L 51/0002; H01L 51/0007; H01L 51/504; H01L 51/5064; H01L 2251/303; H01L 27/3209; H01L 51/5278; H01L 51/5048–5084; H01L 2251/301–305; H01L 51/009; H01L 51/5056–5068; H01L 51/506; H01L 51/0084; H10K 85/371; H10K 50/00; H10K 71/00; H10K 85/30; H10K 99/00; H10K 50/17; H10K 71/15; H10K 71/441; H10K 50/155; H10K 50/19; H10K 85/351; H10K 71/12; H10K 71/40; H10K 85/344; H10K 2102/351; H10K 2102/361; H10K 50/15–157; H10K 85/341; C07F 9/00; C07F 11/00; C07F 13/00
  See application file for complete search history.

(56) References Cited

U.S. PATENT DOCUMENTS

| | | | | |
|---|---|---|---|---|
| 9,391,277 | B2* | 7/2016 | Ueno | H05B 33/10 |
| 2006/0145604 | A1* | 7/2006 | Liao | H01L 51/506 |
| | | | | 313/506 |
| 2007/0170843 | A1 | 7/2007 | Kawamura et al. | |
| 2007/0241676 | A1* | 10/2007 | Park | H01L 51/5096 |
| | | | | 428/917 |
| 2009/0160325 | A1* | 6/2009 | Yatsunami | C09K 11/06 |
| | | | | 313/504 |
| 2009/0174315 | A1* | 7/2009 | Furukawa | H01L 51/5278 |
| | | | | 313/504 |
| 2009/0212280 | A1* | 8/2009 | Werner | C09K 11/06 |
| | | | | 257/40 |
| 2010/0289010 | A1* | 11/2010 | Cho | H01L 51/5036 |
| | | | | 264/293 |
| 2011/0037065 | A1* | 2/2011 | Ueno | H01L 51/009 |
| | | | | 257/40 |
| 2011/0048538 | A1 | 3/2011 | Huang et al. | |
| 2011/0068327 | A1 | 3/2011 | Morishima | |
| 2012/0091448 | A1* | 4/2012 | Ueno | H01L 51/5088 |
| | | | | 257/40 |
| 2012/0119200 | A1* | 5/2012 | Ueno | C09K 11/02 |
| | | | | 257/E51.026 |
| 2012/0138916 | A1 | 6/2012 | Ueno et al. | |
| 2013/0009131 | A1* | 1/2013 | Kazlas | H01L 51/5004 |
| | | | | 257/13 |
| 2013/0101867 | A1 | 4/2013 | Yukinobu et al. | |
| 2013/0313534 | A1 | 11/2013 | Liu et al. | |
| 2015/0372250 | A1* | 12/2015 | Kum | H10K 50/131 |
| | | | | 257/40 |
| 2016/0056387 | A1 | 2/2016 | Kim et al. | |
| 2016/0093812 | A1 | 3/2016 | Stoessel et al. | |
| 2017/0033301 | A1* | 2/2017 | Han | H10K 50/18 |
| 2017/0313595 | A1 | 11/2017 | Tsuchiya et al. | |

FOREIGN PATENT DOCUMENTS

| | | | | |
|---|---|---|---|---|
| EP | 2445027 | A1 | 4/2012 | |
| JP | 2008041894 | A * | 2/2008 | |
| JP | 2009290205 | A | 12/2009 | |
| JP | 2011096733 | A | 5/2011 | |
| JP | 5240532 | B2 | 7/2013 | |
| JP | 2013232315 | A | 11/2013 | |
| JP | 5572920 | B2 | 8/2014 | |
| JP | 5862189 | B2 | 2/2016 | |
| JP | 20160023992 | A | 2/2016 | |
| KR | 20060135801 | A | 12/2006 | |
| KR | 20080095244 | A | 10/2008 | |
| KR | 20100054798 | A | 5/2010 | |
| KR | 20110107447 | A | 10/2011 | |
| KR | 20120112277 | A | 10/2012 | |
| KR | 20130096531 | A | 8/2013 | |
| KR | 20140083190 | A * | 7/2014 | ........... H10K 50/171 |
| KR | 101562558 | B1 | 10/2015 | |
| KR | 20150143552 | A | 12/2015 | |
| WO | WO-2015065074 | A1 * | 5/2015 | ......... H01L 51/5088 |
| WO | 2016068076 | A1 | 5/2016 | |

OTHER PUBLICATIONS

Zhang, Xinwen, et al. "Improving the stability of organic light-emitting devices using a solution-processed hole-injecting layer." Applied surface science 255.18 (2009): 7970-7973. (Year: 2009).*
English translation of JP 2008041894 A obtained from Global Dossier. (Year: 2008).*
Xu, Zhen-He, et al. "Synthesis, characterization, and crystal structures of two new polyoxomolybdate wheel clusters." Inorganic Chemistry Communications 9.12 (2006): 1315-1318. (Year: 2006).*
Li, Xinchen, et al. "Over 1.1 ev workfunction tuning of cesium intercalated metal oxides for functioning as both electron and hole transport layers in organic optoelectronic devices." Advanced Functional Materials 24.46 (2014): 7348-7356. (Year: 2014).*
Wang, Jian, Yun-Ju Lee, and Julia WP Hsu. "Sub-10 nm copper chromium oxide nanocrystals as a solution processed p-type hole transport layer for organic photovoltaics." Journal of Materials Chemistry C 4.16 (2016): 3607-3613. (Year: 2016).*
Sumets, M. "Charge transport in LiNbO3-based heterostructures." Journal of Nonlinear Optical Physics & Materials 26.01 (2017): 1750011. (Year: 2017).*
Vanadium (III) acetylacetonate, Wikipedia, 2021 (Year: 2021).*
English translation of WO-2015065074-A1 obtained from Google Patents. (Year: 2015).*
Long, De-Liang, and Leroy Cronin, Towards Polyoxometalate-Integrated Nanosystems, Chem. Eur. J. 2006, 12, 3698-3706. (Year: 2006).*
English translation of CN 104576955 A obtained by Espacenet (Year: 2015).*
English translation of KR 20140083190 A obtained from Espacenet (Year: 2014).*
Extended European Search Report including Written Opinion for Application No. EP17796376.6 dated Mar. 20, 2019.
Zhang Dan-Dan et al: "Realizing both improved luminance and stability in organic light-emitting devices based on a solution-processed inter-layer composed of MoOx and Au nanoparticles mixture", Organic Electronics, Feb. 20, 2014, vol. 15, No. 4, pp. 961-967, XP028632855.
Search report from International Application No. PCT/KR2017/004821, dated Jul. 24, 2017.

* cited by examiner

ORGANIC ELECTROLUMINESCENT DEVICE AND MANUFACTURING METHOD THEREFOR

CROSS-REFERENCE TO RELATED APPLICATIONS

The present application is a national phase entry under 35 U.S.C. § 371 of International Application No. PCT/KR2017/004821 filed May 10, 2017, which claims priority from Korean Patent Application No. 10-2016-0057050 filed May 10, 2016, all of which are incorporated herein by reference.

TECHNICAL FIELD

The present specification relates to a method for manufacturing an organic electroluminescent device and an organic electroluminescent device manufactured by the same.

BACKGROUND ART

An organic light emission phenomenon is one of the examples of converting an electric current into visible rays through an internal process of a specific organic molecule. The principle of the organic light emission phenomenon is as follows. When an organic material layer is disposed between an anode and a cathode, if an electric current is applied between the two electrodes, electrons and holes are injected into the organic material layer from the cathode and the anode, respectively. The electrons and the holes which are injected into the organic material layer are recombined to form an exciton, and the exciton falls down again to the ground state to emit light. An organic electroluminescent device using this principle may be generally composed of a cathode, an anode, and an organic material layer disposed therebetween, for example, an organic material layer including a hole injection layer, a hole transporting layer, a light emitting layer, and an electron transporting layer.

When an organic electroluminescent device is manufactured by using a vacuum process, there are disadvantages in that equipment investment costs and process costs are high, there is a limitation in uniformly making the organic electroluminescent device have a large area, and the material utilization rate is low due to the high ratio of material discarded without being deposited onto a substrate during the deposition. In contrast, when an organic electroluminescent device is manufactured using a solution process, there are advantages in that production costs may be lowered by excluding expensive deposition equipment, and the large area is easily achieved. However, when layers constituting an organic electroluminescent device are stacked through a solution process unlike a deposition process, it is highly likely that a lower layer may be damaged by a process of forming an upper layer. That is, there may occur a phenomenon in which a material in the lower layer is dissolved again by a solvent or ink used in the solution process, and thus is mixed with the upper layer, or a thin film is physically damaged. In order to prevent the phenomenon, a solvent used in each layer is prepared so as to have no solubility for each other, or a process in which a lower layer is not melted when an upper layer is formed through a post-treatment for a lower layer is also added.

In an organic electroluminescent device manufactured by the solution process system, a hole injection layer material most frequently used is a conductive polymer. Since these conductive polymers do not normally have a high solubility themselves, and are usually in the form of an aqueous solution, solvent characteristics thereof are different from those of organic solvents used in the upper layer, and as a result, the processability is secured to a certain degree. Further, an organic electroluminescent device manufactured by using these conductive polymers appears to exhibit a relatively low driving voltage. However, these conductive polymers are usually characterized by damaging an electrode material being a lower layer by using an acidic dopant material with a low pH, and have a disadvantage in that service life characteristics deteriorate due to the characteristic. Meanwhile, as a method for forming a hole injection layer in another form, a method for forming the hole injection layer by doping an aryl amine-based material with an ionic material or an n-type material such as TCNQ is known. However, this method still has a resistance problem with a solvent or ink of a post-process as previously mentioned.

DETAILED DESCRIPTION OF THE INVENTION

Technical Problem

The present specification has been made in an effort to provide a composition for coating a hole injection or transporting layer or a charge generating layer, which may be used during the manufacturing of an organic electroluminescent device by a solution process, a method for manufacturing an organic electroluminescent device using the same, and an organic electroluminescent device manufactured by using the same.

Technical Solution

An exemplary embodiment of the present specification provides a coating composition for a hole injection or transporting layer or a charge generating layer of an organic electroluminescent device, the coating composition including:

an organic metal complex including one or more of Group V, Group VI, and Group VII transition metals;

an organic metal complex or metal salt including one or more of Group I, Group VIII, Group XI, and Group XII metals; and an organic solvent.

Another exemplary embodiment of the present specification provides a method for manufacturing an organic electroluminescent device, the method including:

preparing a substrate;

forming a first electrode on the substrate;

forming an organic material layer having one or more layers on the first electrode; and forming a second electrode on the organic material layer, in which the method further includes forming a hole injection or transporting layer or a charge generating layer between the first electrode and the organic material layer, between the second electrode and the organic material layer, or between the organic material layers when the two or more organic material layers are present by a coating method using the coating composition according to the exemplary embodiment.

Still another exemplary embodiment of the present specification provides an organic electroluminescent device including:

a first electrode; a second electrode; and an organic material layer having one or more layers disposed between the first electrode and the second electrode, in which the organic electroluminescent device further includes a hole injection or transporting layer or a charge generating layer which is disposed between the first electrode and the organic material layer, between the second electrode and the organic material layer, or between the organic material layers when the two or more organic material layers are present, and is composed of a metal oxide including one or more of Group V, Group VI, and Group VII transition metals and one or more of Group I, Group VIII, Group XI, and Group XII metals.

Yet another exemplary embodiment of the present specification provides an organic electroluminescent device including:

a first electrode; a second electrode; and an organic material layer having one or more layers disposed between the first electrode and the second electrode, in which the organic electroluminescent device further includes a hole injection or transporting layer or a charge generating layer which is disposed between the first electrode and the organic material layer, between the second electrode and the organic material layer, or between the organic material layers when the two or more organic material layers are present, and is formed by using the coating composition according to the exemplary embodiment.

Advantageous Effects

In the present specification, a Group V, Group VI or Group VII transition metal may be doped or mixed with one or more of Group I, Group VIII, Group XI, and Group XII metals as described above in order to form a hole injection or transporting layer or a charge generating layer of an organic electroluminescent device, thereby diversifying charge injection characteristics by varying a work function of a layer to be formed by using the doped or mixed metals.

Further, the present specification may provide a coating composition including a Group V, Group VI, or Group VII transition metal, an organic metal complex or metal salt including Group I, Group VIII, Group XI, and Group XII metal, and an organic solvent as described above in order to form a hole injection or transporting layer or a charge generating layer of an organic electroluminescent device, and may provide an organic electroluminescent device whose characteristics are enhanced because an electrode such as an ITO electrode is not damaged by using the coating composition, interface characteristics with the electrode are improved, and resistance to a solvent used for an upper layer such as a hole transporting layer or a light emitting layer is excellent.

In the case of a hole injection or transporting layer or a charge generating layer obtained from the ink composition, the solvent is removed during a drying process after the coating, and an organic material ligand of an organic metal complex is decomposed by reacting with oxygen in the air and thus removed during a heat treatment process, and the layer is present in the form of a finally doped metal oxide, and as a result, a deterioration in charge characteristics by the residual organic material is minimized, and particularly, an organic light emitting device having a long service life may be obtained. Further, when the ligand is oxidized while being decomposed during the heat treatment process of the coating film, the central metal element is reacted with oxygen in the air to generate a M-O-M bond, and as a result, $MO_3$, for example, a form of $MoO_3$ or $WO_3$ and $V_2O_5$ is produced, and simultaneously, another type of oxide such as $W_2O_5$ or $Mo_2O_5$ may be partially produced due to a M-M bond in which metal atoms are bonded to each other in some parts, thereby imparting doping effects of the metal oxide caused by oxygen deficiency known as the doping mechanism of the general metal oxide. As a result, in the case of a hole injection layer formed of vacuum deposited $MoO_3$ or $WO_3$, and the like, the driving voltage is sharply increased while the thickness is increased, and unlike the hole injection layer almost acting as an insulator, particularly, when the thickness is 30 nm or more, a hole injection or transporting layer or a charge generating layer, which is composed of a metal oxide and prepared by using the ink composition according to the present specification, has an increase in charge concentration and charge mobility in the entire metal oxide thin film due to the aforementioned doping effects, and thus provides a characteristic in which an increase in driving voltage does not occur even when the thickness is increased to 30 nm or more.

Further, during the heat treatment process after the coating, the metal in the organic metal complex is bonded to an oxygen atom present at the interface of the ITO while the bond between the metal in the organic metal complex and the organic material ligand is broken, and as a result, the interface between an anode and a metal oxide thin film being a hole injection layer is improved while the bond such as the Metal-O—In or Metal-O—Sn is produced, so that unlike the deposited thin film, the mechanical strength of the thin film is increased, the interface characteristics are improved, and as a result, the charge may smoothly move between the anode and the metal oxide thin film.

In addition, by using the organic solvent as described above, the thin film formation characteristics after the coating are excellent, a mass production process of an inkjet, and the like is enabled, and device characteristics may be improved by eliminating residual moisture, as compared to the case of using an aqueous solution obtained by adding and dissolving a metal oxide powder such as $MoO_3$ or $V_2O_5$ itself into $H_2O_2$ or $NH_4OH$, and the like. In particular, according to exemplary embodiments of the present specification, by using the above-described organic metal complex even though a substituent such as a halogen group is partially included, it is possible to prepare an ink which is substituted with a solvent and thus has an appropriate viscosity and good coatability while being dissolved in ketone and an alcohol-based or ester-based solvent, and it is possible to advantageously manufacture a hole injection or transporting layer or a charge generating layer by a coating method using the ink.

101: Substrate

201: Anode

301: Hole injection layer

401: Hole transporting layer

501: Light emitting layer

601: Electron transporting layer
701: Cathode

BEST MODE

Hereinafter, the present specification will be described in detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

An exemplary embodiment of the present specification provides a coating composition for a hole injection or transporting layer or a charge generating layer of an organic electroluminescent device, the coating composition including: an organic metal complex including one or more of Group V, Group VI, and Group VII transition metals; an organic metal complex or metal salt including one or more of Group I, Group VIII, Group XI, and Group XII metals; and an organic solvent.

Since the Group V, Group VI, or Group VII transition metal and the Group I, Group VIII, Group XI, and Group XII metals are different in an oxidation number of the oxide of the metal, and these oxides have different work functions, the work functions of thin films finally produced by doping or mixing the oxides vary. Accordingly, the work function may be diversified by adjusting the type and amount of metal to be doped or mixed. As a result, a balance between holes and electrons in a device may be adjusted by matching the work function according to the type or characteristic of a hole transporting layer, a light emitting layer, and an electron transporting layer disposed on an upper layer, thereby achieving a long service life and adjusting light emitting efficiency.

The organic metal complex including one or more of Group V, Group VI, or Group VII transition metals may include preferably Mo, W, V, or Re, and more preferably Mo.

The organic metal complex or metal salt including one or more of Group I, Group VIII, Group XI, and Group XII metals may include an alkali metal such as Li, Na, K, Rb, and Cs, a transition metal such as Fe, Ru, Os, Cu, Ag, Au, Zn, and Cd, and the like.

The organic metal complex or metal salt including one or more of Group I, Group VIII, Group XI, and Group XII metals includes more preferably an alkali metal of Group I such as Li, Na, K, Rb, or Cs, and may include more preferably Na.

According to an example, the coating composition may include an organic metal complex including Mo, W, V, or Re, and an organic metal complex or metal salt including Li, Na, K, Rb, or Cs.

According to an example, the coating composition may include an organic metal complex including Mo, W, V, or Re, and an organic metal complex or metal salt including Fe, Ru, Cu, Ag, Au, or Zn.

It is preferred that the organic metal complex including Mo, W, V, or Re has a sufficient organic material portion in order to have good solubility and good coatability, if possible, but since it is preferred that the ligands of the organic metal complex are removed during the heat treatment, such that the organic metal complex becomes a metal oxide, it is preferred to have a ligand which is thermally decomposed at 350° C. or less. Further, a precursor for a metal element to be mixed with the organic metal complex may have a ligand such as an organic complex of each element, for example, methoxide, ethoxide, isopropoxide, butoxide, acetate, and acetylacetonate, and the precursor may also be a halide, a nitrate, and a sulfate. However, it is preferred that these organic ligands and anion portions of the salt do not remain after the heat treatment.

According to an example, the coating composition may include an organic metal complex including Mo, W, V, or Re, and an organic metal complex or metal salt including Cu.

According to another example, the coating composition may include an organic metal complex including Mo, W, V, or Re, and an organic metal complex or metal salt including Na.

According to still another example, the coating composition may include an organic metal complex including Mo, W, V, or Re, and an organic metal complex or metal salt including Ag.

According to yet another example, the coating composition may include an organic metal complex including Mo, W, V, or Re, and an organic metal complex or metal salt including Fe.

According to still yet another example, the coating composition may include an organic metal complex including Mo, W, V, or Re, and an organic metal complex or metal salt including Cs.

According to a further example, the coating composition may include an organic metal complex including Mo, W, V, or Re, and an organic metal complex or metal salt including Zn.

According to another further example, the coating composition may include an organic metal complex including Mo, W, V, or Re, and an organic metal complex or metal salt including Au.

According to still another further example, the coating composition may include an organic metal complex including Mo, W, V, or Re, and an organic metal complex or metal salt including K.

According to yet another further example, the coating composition may include an organic metal complex including Mo, W, V, or Re, and an organic metal complex or metal salt including Rb.

According to still yet another further example, the coating composition may include an organic metal complex including Mo, W, V, or Re, and an organic metal complex or metal salt including Ru.

According to another exemplary embodiment, the content ratio of the Group V, Group VI, or Group VII organic metal complex in the coating composition is 0.01 to 50 wt %, and the ratio of the Group I, Group VIII, Group XI, and Group XII metal element to be mixed with the Group V, Group VI or Group VII transition metal atom is 0.01 to 50 at %. The Group V, Group VI or Group VII metal in the coating composition may be present in an amount of 50 to 99.99 at % based on the total metal atom.

In the exemplary embodiment, the organic metal complex and metal salt may be a complex having an oxidation number from −2 to +6. The organic metal complex includes the above-described organic ligand bonded to the metal. The organic ligand is not particularly limited, but may be selected in consideration of solvent solubility, or interface characteristics with an adjacent organic material layer, and the like. Examples of the organic ligand include carbonyl, an acetyl group, an acetylacetonate group, a methyl acetoacetate group, an ethylacetoacetate group, thioacetate, isocyanate, cyanate, isocyanate, nitrate, hexanoate, citrate, a halogen atom, and the like. Further, the organic ligand may have a structure including an aromatic ring and/or a hetero ring, and may be, for example, benzene, triphenylamine, fluorene, biphenyl, pyrene, anthracene, carbazole, phenylpyridine, trithiophene, phenyloxadiazole, phenyltriazole, benzoimidazole, phenyltriazine, benzodiathiazine, phenylquinoxaline, phenylenevinylene, phenylsilole, or a combination of these structures. The aromatic ring or the hetero ring may have a substituent, and for example, the substituent may be an alkyl group, a halogen atom, an alkoxy group, a cyano group, a nitro group, and the like. The alkyl group and the alkoxy group may have, for example, 1 to 12 carbon atoms.

Specific examples of the organic ligand include an alkoxy-based or acetate-based ligand such as acetylacetonate (acac), ethylacetoacetate, methylacetoacetate, OPh, carbonyl, methoxy, ethoxy, propoxy, isopropoxy, butoxy, sec-butoxy, tert-butoxy, pentoxy, hexyloxy, heptyloxy, octyloxy, and ethylhexyloxy, but are not limited thereto. Further, the organic ligand may be a ligand in a form that the organic ligands and a halogen group co-exist.

The organic metal complex may include a metal oxide. The metal oxide may include a metal oxide including one or more of Group V, Group VI, or Group VII transition metals, or one or more of Group I, Group VIII, Group XI, and Group XII metals, and the above-described organic ligand may be coordinated to the metal oxide. Examples of the organic metal complex include $W(CO)_6$, $W(acac)_3$, $Mo(CO)_6$, $WO_2Cl_2$, $MoO_2(acac)_2$, sodium nitrate, $Zn(acac)_2$, iron acetate, and cesium nitrate. As another example, when the organic metal complex includes V, the organic metal complex may be $VO(acac)_2$ in which a partial oxygen is substituted, and may be $V(acac)_3$ in which an oxygen is unsubstituted. As still another example, even when the organic metal complex includes W, the organic metal complex may also be $W(acac)_3$, and may also be $WO(acac)_2$ which is partially oxidized.

In addition, the organic metal complex may be in a form that two or more different ligands are bonded to each other. For example, the organic metal complex may be molybdenum dichloride dioxide.

In an exemplary embodiment, the organic solvent may include at least one of a hydroxy group and a ketone group.

In an exemplary embodiment, the organic solvent is an alcohol-based solvent.

In another exemplary embodiment, the organic solvent is a ketone-based solvent.

In the present specification, examples of an organic solvent having a hydroxy group or a ketone group may include acetone, methyl ethyl ketone, diethyl ketone, cyclohexanone, cyclopentanone, isophorone, acetylacetone, tetralone, ethyl benzoate, methyl benzoate, butyl benzoate, ethyl acetate, ethyl acetoacetate, diethyl acetoacetate, methyl benzoate, ethyl benzoate, methanol, ethanol, propanol, isopropanol, butanol, sec-butanol, tert-butanol, pentanol, cyclo pentanol, hexanol, cyclo hexanol, heptanol, and octanol, and may be a solvent represented by the following General Formula 1.

General Formula 1

In General Formula 1, n is an integer from 1 to 20, l and m are each or both an integer from 0 to 5, and $R_1$, $R_2$, $R_3$ and $R_4$ are each or all a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 carbon atoms, a heteroaryl group having 2 to 40 carbon atoms, or an ester group having 1 to 20 carbon atoms.

According to an exemplary embodiment, the organic solvent has a boiling point of preferably 350° C. or less. As a specific example, it is possible to use ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2-propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, triethylene glycol, and the like.

The solvent represented by General Formula 1 has an advantage in that it is possible to make an oxide thin film in which an organic material is not left behind after the manufacture of a device by allowing a precursor of a metal oxide not to be easily changed into another oxidation state or material without forming a chemically strong bond with the above-described organic metal complex used particularly as the precursor of the metal oxide.

According to an exemplary embodiment, it is preferred that the content of the organic metal complex including one or more of Group V, Group VI, or Group VII transition metals in the coating composition is 0.01 to 50 wt %. According to an exemplary embodiment, the content of the organic metal complex or metal salt including one or more of the Group I, Group VIII, Group XI, and Group XII metals in the coating composition may be 0.01 to 50 wt %, preferably 1 to 20 wt %, and more preferably 1 to 15 wt %, based on the Group V, Group VI, or Group VII transition metal. When the organic metal complex or metal salt including one or more of the Group I, Group VIII, Group XI, and Group XII metals satisfies the content range with respect to the Group V, Group VI or Group VII transition metal, there is a benefit in that service life characteristics of the device are excellent.

The coating composition may further include an additive in addition to an organic metal complex in order to improve characteristics such as coatability and viscosity. For example, the additive may include any one or more selected from the group consisting of a dispersant, a surfactant, a polymer, a binder, a crosslinking agent, an emulsifier, an antifoaming agent, a drying agent, a filler, a bulking agent, a thickening agent, a film conditioning agent, an antioxidant, a fluidizer, a smoothness additive, and a corrosion inhibitor.

Another exemplary embodiment of the present specification relates to a method for manufacturing an organic electroluminescent device, the method including:
preparing a substrate;
forming a first electrode on the substrate;

forming an organic material layer having one or more layers on the first electrode; and forming a second electrode on the organic material layer, in which the method further includes forming a hole injection or transporting layer or a charge generating layer between the first electrode and the organic material layer, between the second electrode and the organic material layer, or between the organic material layers when the two or more organic material layers are present by a coating method using the above-described coating composition according to the exemplary embodiment.

The coating method for forming the hole injection or transporting layer or the charge generating layer may be, for example, any one selected from the group consisting of a spin coating system, an inkjet system, nozzle printing, wet coating, spray coating, doctor blade coating, contact printing, top feed reverse printing, bottom feed reverse printing, nozzle feed reverse printing, gravure printing, microgravure printing, reverse microgravure printing, roll coating, slot die coating, capillary coating, jet deposition, and spray deposition, and may be preferably spin coating, inkjet coating, nozzle printing, or the like.

The coating method may be carried out by coating the above-described composition onto a first electrode or a second electrode, and then drying the composition. A drying or heat treatment or a heat treatment after drying can be carried out in nitrogen or in the air, but the drying or heat treatment or the heat treatment after drying in the air is advantageous in removing a solvent and an organic material ligand and in converting an organic metal complex into an oxide. Further, the treatment temperature for the heat treatment may vary according to the organic metal complex used, but it is preferred that the heat treatment is carried out at 150° C. or more and 300° C. or less, preferably 200° C. or more and 300° C. or less.

In the present specification, when the coating composition includes an organic metal complex including one or more of Group V, Group VI or Group VII transition metals; and an organic metal complex or metal salt including one or more of Group I, Group VIII, Group XI, and Group XII metals, and the heat treatment temperature for a hole injection or transporting layer or a charge generating layer is within the temperature range, a device having excellent service life characteristics may be manufactured throughout the temperature range.

However, when the coating composition includes: an organic metal complex including one or more of Group V, Group VI or Group VII transition metals; and an organic metal complex or metal salt including a metal element belonging to the groups other than Group I, Group VIII, Group XI, and Group XII, particularly, a Ti element corresponding to Group IV, it is difficult to manufacture a device having excellent service life characteristics, and it is not possible to manufacture a device having excellent service life characteristics over the process temperature because the service life characteristics of the device are enhanced only at a specific temperature.

According to an exemplary embodiment, a hole injection or transporting layer or a charge generating layer formed by using the coating composition has a thickness of 1 nm to 1,000 nm. In general, in an organic electroluminescent device, a total thickness of the device needs to be optimized due to cavity effects, and during the optimization of the thickness, the thickness thereof needs to be changed from several nm to 1 micrometer according to a material for an upper layer. At this time, when the thickness of the charge injection or transporting layer may be diversified without any deterioration in characteristics of the device, the restrictions on the device structure of the upper layer and the change in thickness are reduced, which is advantageous to provide optimized device characteristics. The hole injection or transporting layer provided in the present invention provides a material and a device, which does not have an increase in voltage according to the thickness.

According to another exemplary embodiment, the manufacturing method further includes forming a hole injection or transporting layer or a charge generating layer formed by using the coating composition, and then annealing the layer. The annealing may be carried out at 150° C. to 250° C., preferably 180° C. to 250° C. Since the annealing in the present invention aims to remove an organic ligand of an organic metal complex and change the organic ligand into a metal oxide during the annealing process, it is preferred that the temperature is high enough for the ligand of the organic metal complex to be decomposed, and it is preferred that the annealing is carried out under an oxygenous atmosphere in order to change the ligand into the oxide.

In the exemplary embodiment, those known in the art may be used in the material and manufacturing method for the other electrodes and organic material layers, except that the hole injection or transporting layer or the charge generating layer is formed by using the above-described coating composition according to the exemplary embodiment.

According to an example, the first electrode is an anode, and the second electrode is a cathode.

According to another example, the second electrode is an anode, and the first electrode is a cathode.

According to an example, the organic material layer includes a light emitting layer.

According to another example, the organic material layer may be composed of a multilayer structure, and for example, includes at least one layer of a light emitting layer, a hole injection layer, a hole transporting layer, an electron transporting layer, an electron injection layer, an electron blocking layer, and a hole blocking layer. For example, the structure of the organic electroluminescent device according to an exemplary embodiment of the present specification is exemplified in FIG. 1.

Figure 1:
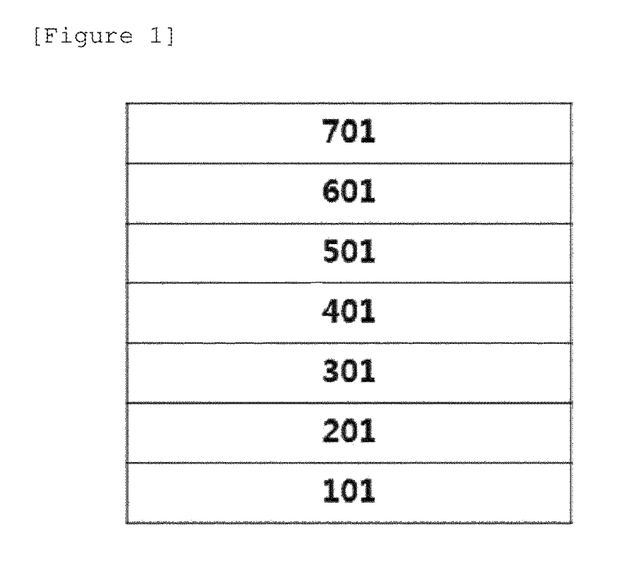
FIG. 1 illustrates an example of an organic electroluminescent device according to an exemplary embodiment of the present specification.

FIG. 1 exemplifies the structure of an organic electroluminescent device in which an anode 201, a hole injection layer 301, a hole transporting layer 401, a light emitting layer 501, an electron transporting layer 601, and a cathode 701 are sequentially stacked on a substrate 101. In FIG. 1, the hole injection layer 301 may be formed by using the above-described coating composition. However, FIG. 1 exemplifies an organic electroluminescent device, and the structure of the organic electroluminescent device is not limited thereto.

When the organic electroluminescent device includes a plurality of organic material layers, the organic material layers may be formed of the same material or different materials.

For example, the organic electroluminescent device of the present specification may be manufactured by sequentially stacking an anode, an organic material layer, and a cathode on a substrate. At this time, the organic electroluminescent device may be manufactured by depositing a metal or a metal oxide having conductivity, or an alloy thereof on a substrate to form an anode, forming an organic material layer including a hole injection layer, a hole transporting layer, a light emitting layer, and an electron transporting layer thereon, and then depositing a material, which may be used as a cathode, thereon, by using a physical vapor deposition (PVD) method such as sputtering or e-beam evaporation. In addition to the method described above, an organic electroluminescent device may be made by sequentially depositing a cathode material, an organic material layer, and an anode material on a substrate. At this time, at least one layer or all of the layers disposed between the anode and the cathode may be formed by using a solution process. Examples of the solution process include a printing method, for example, inkjet printing, nozzle printing, offset printing, transfer printing or screen printing, and the like, but are not limited thereto. When the solution process is used, there is an economical effect in terms of time and costs during the manufacture of a device. When the organic material layer is subjected to a solution process, a heat treatment or a light treatment may be additionally carried out, if necessary. Here, the temperature and time for the heat treatment may be selected according to process conditions or used materials, and the heat treatment may be carried out, for example, at 85° C. to 300° C. for 1 minute to 1 hour.

As the anode material, materials having a high work function are usually preferred so as to facilitate the injection of holes into an organic material layer. Specific examples of the anode material which may be used in the present invention include: a metal, such as vanadium, chromium, copper, zinc, and gold, or an alloy thereof; a metal oxide, such as zinc oxide, indium oxide, indium tin oxide (ITO), indium gallium zinc oxide (IGZO), fluorine-doped tin oxide (FTC)), and indium zinc oxide (IZO); a combination of metal and oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

As the cathode material, materials having a low work function are usually preferred so as to facilitate the injection of electrons into an organic material layer. Specific examples of the cathode material include: a metal, such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

When an additional hole injection layer is formed in addition to the hole injection or transporting layer formed by using the above-described coating composition including an organic metal complex, and a material for the hole injection layer is preferably a compound which has a capability of transporting holes and thus has an effect of injecting holes at an anode and an excellent effect of injecting holes for a light emitting layer or a light emitting material, prevents excitons produced from a light emitting layer from moving to an electron injection layer or an electron injection material, and is also excellent in the ability to form a thin film. The highest occupied molecular orbital (HOMO) of the hole injection material is preferably a value between the work function of the anode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transporting layer is a layer which accepts holes from a hole injection layer and transports the holes to a light emitting layer, and a hole transporting material is suitably a material having high hole mobility which may accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The light emitting material is a material which may emit light in a visible light region by accepting and combining holes and electrons from a hole transporting layer and an electron transporting layer, respectively, and is preferably a material having good quantum efficiency for fluorescence or phosphorescence. Specific examples thereof include: an 8-hydroxy-quinoline aluminum complex ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, lubrene, and the like, but are not limited thereto.

The light emitting layer may include a host material and a dopant material. Examples of the host material include a fused aromatic ring derivative, or a hetero ring-containing compound, and the like. Specifically, examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transporting layer is a layer which accepts electrons from an electron injection layer and transports the electrons to a light emitting layer, and an electron transporting material is suitably a material having high electron mobility which may accept electrons proficiently from a cathode and transfer the electrons to a light emitting layer. Specific examples thereof include: an Al complex of 8-hydroxyquinoline; a complex including $Alq_3$; an organic radical compound; a hydroxyflavone-metal complex; and the like, but are not limited thereto. The electron transporting layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an effect of injecting electrons from a cathode and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and a derivative thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato)(1-naphtholato) aluminum, bis(2-methyl-8-quinolinato)(2-naphtholato) gallium, and the like, but are not limited thereto.

The hole blocking layer is a layer which blocks holes from reaching a cathode, and may be generally formed under the same conditions as those of the hole injection layer. Specific examples thereof include an oxadiazole derivative or a triazole derivative, a phenanthroline derivative, BCP, an aluminum complex, and the like, but are not limited thereto.

Still another exemplary embodiment of the present specification provides an organic electroluminescent device including:

a first electrode; a second electrode; and an organic material layer having one or more layers disposed between the first electrode and the second electrode, in which the organic electroluminescent device further includes a hole injection or transporting layer or a charge generating layer which is disposed between the first electrode and the organic material layer, between the second electrode and the organic material layer, or between the organic material layers when the two or more organic material layers are present, and is composed of a metal oxide including one or more of Group V, Group VI, and Group VII transition metals and one or more of Group I, Group VIII, Group XI, and Group XII metals.

Yet another exemplary embodiment of the present specification provides an organic electroluminescent device including: a first electrode; a second electrode; and an organic material layer having one or more layers disposed between the first electrode and the second electrode, in which the organic electroluminescent device further includes a hole injection or transporting layer or a charge generating layer which is disposed between the first electrode and the organic material layer, between the second electrode and the organic material layer, or between the organic material layers when the two or more organic material layers are present, and is formed by using the above-described coating composition according to the exemplary embodiments.

The hole injection or transporting layer or the charge generating layer formed by using the coating composition is composed of a metal oxide. Here, the metal oxide includes one or more of Group V, Group VI, and Group VII transition metals and one or more of Group I, Group VIII, Group XI, and Group XII metals.

According to another exemplary embodiment, the content ratio of the oxide of Group V, Group VI or Group VII transition metal among the total metal atoms in the hole injection or transporting layer or the charge generating layer is 50 at % to 99.99 at %. Further, the ratio of the Group I, Group VIII, Group XI, and Group XII metal atom to be mixed with the transition metals is 0.01 at % to 50 at % based on 100 at % of the Group V, Group VI or Group VII transition metal. According to an example, when the Group V, Group VI, or Group VII transition metal is defined as M1, and a metal element to be doped is defined as M2, the hole injection or transporting layer or the charge generating layer may be represented by $M1xM2yOz$. At this time, in case of $0 < x+y \leq 100$, $0 < z \leq 400$, $50 < x \leq 99.99$, and $0.01 \leq y < 50$.

According to another example, the hole injection or transporting layer or the charge generating layer has a work function of 5.0 to 7.0.

According to an Example, a hole injection or transporting layer or a charge generating layer formed by using the coating composition has a thickness of 1 nm to 1,000 nm. At this time, in the hole injection or transporting layer or the charge generating layer, the charge concentration and the mobility are increased by the doping effects occurring during the solution process, and as a result, a decrease in voltage caused by the thickness does not occur.

According to an exemplary embodiment, the hole injection or transporting layer or the charge generating layer includes a M-O bond and a M-M bond, and here, M is a metal selected from Group I, Group V to Group VIII, Group XI, and Group XII.

Figure 2:
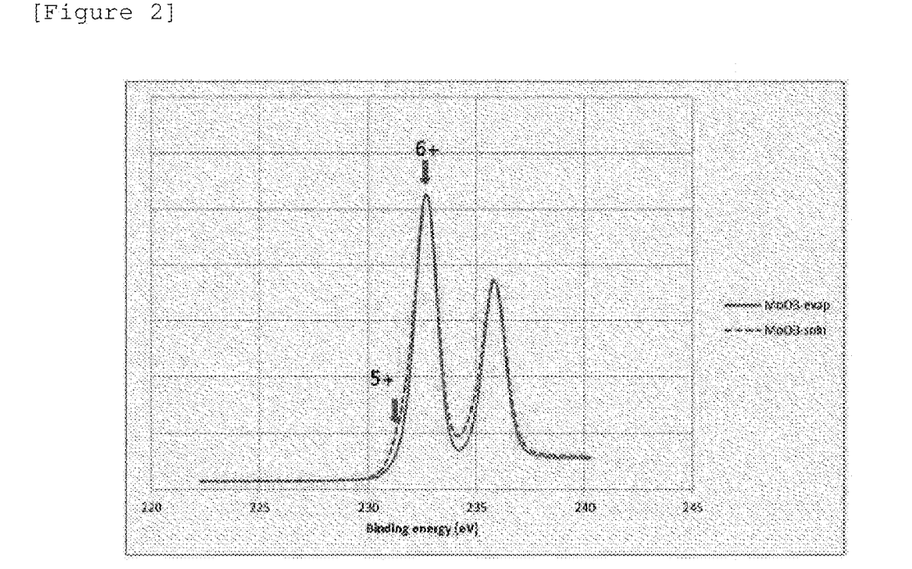
FIG. 2 illustrates an XPS result which is capable of confirming a Mo—Mo bond when a thin film is formed by using a coating composition according to an exemplary embodiment of the present invention.

According to an exemplary embodiment, the hole injection or transporting layer or the charge generating layer includes $MO_3$ and $M_2O_5$, and here, M is a metal selected from Group I, Group V to Group VIII, Group XI, and Group XII. For example, in the case of $MoO_3$, when the Mo—Mo bond occurs by the solution process, $MoO_3$ has an oxidation number of +5 in addition to +6, and as a result of analyzing a thin film obtained through the solution process by means of XPS, it can be confirmed that a Mo peak having an oxidation number of +5, which is a low oxidation number, is detected as illustrated in FIG. 2. Here, the amount of Mo having an oxidation number of +5 is not particularly limited as long as the amount is larger than 0.

According to another exemplary embodiment, the hole injection or transporting layer or the charge generating layer is brought into contact with a first electrode or a second electrode and forms a M-O—X bond with an interface with the first electrode or the second electrode with which the hole injection or transporting layer or the charge generating layer is brought into contact, and here, M is a metal selected from Group I, Groups V to VIII, Group XI, and Group XII, and X is one of elements constituting the first electrode or the second electrode with which the hole injection or transporting layer or the charge generating layer is brought into contact. For example, when the M-O—X bond is formed between the electrode and the hole injection layer thin film as described above, the adhesive strength may be improved, and the mechanical strength of the hole injection layer itself may be increased.

For example, the hole injection or transporting layer or the charge generating layer is brought into contact with a first electrode composed of ITO, and forms a Mo—O—In or Mo—O—Sn bond at the interface with the first electrode.

In the device according to another exemplary embodiment, the hole injection or transporting layer or the charge generating layer has a thickness of 1 to 1,000 nm, and there is no change in driving voltage between the case where the hole injection or transporting layer or the charge generating layer has a thickness of 30 nm or less and the case where the hole injection or transporting layer or the charge generating layer has a thickness of 30 nm or more. For example, when the $MoO_3$ layer was formed by the deposition method as in the following Example 1, the driving voltage was greatly increased even when the thickness was 40 nm, but when the solution process was used, as a result of comparing Example 14 with Example 19, it could be confirmed that an increase in voltage was not observed in the case where the thickness was 30 nm and in the case where the thickness was 50 nm. For example, an increase in voltage within the thickness range may be within 20%, more preferably within 5%.

According to still another example, a hole injection or transporting layer or a charge generating layer formed by using the coating composition is annealed. For example, the hole injection or transporting layer or the charge generating layer is annealed at a temperature of 150° C. to 250° C., preferably 180° C. to 250° C.

For the other configuration of the organic electroluminescent device, those described above and known in the art may be applied.

The organic electroluminescent device according to the present specification may be a top emission type, a bottom emission type, or a dual emission type according to the material to be used.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below. The Examples of the present specification are provided for more completely explaining the present specification to a person with ordinary skill in the art.

Example 1

A solution in which copper acetate and $Mo(CO)_6$ at a weight ratio of 0.8:99.2 were dissolved at a concentration of 4 wt % in cyclohexanone was prepared. A glass substrate coated with ITO was washed sequentially with water and isopropanol, and then the mixed solution was spin-coated onto an ITO-deposited base material at 1,000 rpm for 30 seconds. The obtained thin film was subjected to heat treatment under an oxygen atmosphere at 200° C. for 15 minutes, thereby forming a hole injection layer having a very uniform thickness of 30 nm.

A hole transporting layer having a thickness of 45 nm was formed on the top of the hole injection layer by using 4,4'-bis[N-(1-naphthyl)-N-phenylamino]biphenyl (NPB).

An electron blocking layer was formed to have a thickness of 15 nm on the top of the hole transporting layer. BH of the following chemical formula being a blue fluorescent host was doped with BD being a blue dopant at a weight ratio of 95:5 on the electron blocking layer, thereby forming a light emitting layer having a thickness of 30 nm.

BH

BD

ET 201

-continued

LiQ

Subsequently, an electron transporting layer ET 201 and LiQ were simultaneously deposited at a weight ratio of 1:1 on the top of the light emitting layer, thereby forming an electron transporting layer having a thickness of 20 nm.

Finally, Al was deposited to have a thickness of 80 nm on the electron transporting layer, thereby manufacturing an organic electroluminescent device. Characteristics of the device are shown in Table 1.

Example 2

A device was manufactured in the same manner as in Example 1, except that $NaNO_3$ and $MoO_2(acac)_2$ at a weight ratio of 5:95 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 1.

Example 3

A device was manufactured in the same manner as in Example 1, except that $AgNO_3$ and $MoO_2(acac)_2$ at a weight ratio of 0.5:99.5 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 1.

Example 4

A device was manufactured in the same manner as in Example 1, except that $Cs_2CO_3$ and $MoO_2(acac)_2$ at a weight ratio of 5:95 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 1.

Example 5

A device was manufactured in the same manner as in Example 1, except that $Zn(acac)_2$ and $MoO_2(acac)_2$ at a weight ratio of 5:95 were dissolved at a concentration of 4 wt % in ethylene glycol monomethyl ether, the resulting solution was coated at 700 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 1.

Example 6

A device was manufactured in the same manner as in Example 1, except that $Zn(acac)_2$ and $MoO_2(acac)_2$ at a weight ratio of 5:95 were dissolved at a concentration of 4 wt % in ethylene glycol monomethyl ether, the resulting solution was coated at 700 rpm on an ITO-deposited base material, and then a heat treatment was carried out under an oxygen atmosphere, thereby preparing a hole injection layer. At this time, the thickness of the hole injection layer was 50 nm. Characteristics of the device are shown in Table 1.

Comparative Example 1

A device was manufactured in the same manner as in Example 1, except that a hole injection layer was prepared to have a thickness of 40 nm by depositing $MoO_3$.

Comparative Example 2

A device was manufactured in the same manner as in Example 1, except that $MoO_2(acac)_2$ was dissolved at a concentration of 4 wt % in cyclohexanone, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 1.

The voltage, efficiency, and service life (LT80) characteristics of the devices manufactured in the above-described Examples 1 to 6 and Comparative Examples 1 and 2 were measured under a condition of 10 mA/cm², and the measurement results are shown in the following Table 1.

TABLE 1

| | Complex to be mixed | Voltage | Efficiency (EQE) | LT80 |
|---|---|---|---|---|
| Example 1 | Cu(II)-acetate | 4.48 | 5.26 | 35 |
| Example 2 | $NaNO_3$ | 4.70 | 4.58 | 42 |
| Example 3 | $AgNO_3$ | 3.82 | 4.80 | 30 |
| Example 4 | $Cs_2CO_3$ | 4.65 | 4.76 | 45 |
| Example 5 | Zn(II)-acetylacetonate | 4.42 | 4.98 | 40 |
| Example 6 | Zn(II)-acetylacetonate | 4.40 | 4.97 | 35 |
| Comparative Example 1 | — | 10 | 1.53 | 2 |
| Comparative Example 2 | — | 4.42 | 4.94 | 20 |

As shown in Table 1, it could be confirmed that a device formed by a solution process exhibited low driving voltage characteristics even at a thickness of 30 nm or more as compared to a device of Comparative Example 1 having a hole injection layer formed by depositing $MoO_3$, and it could be confirmed that the devices, in which doping with the other elements was performed had more improved service life characteristics than the device of Comparative Example 1. These results may be because the work function was changed by doping a transition metal such as Mo, W, and V with the above-described other elements, or the balance between holes and electrons in the device was adjusted by changing the mobility of the injected holes.

Example 7

A solution in which copper acetate and Mo(CO)₆ at a weight ratio of 1:99 were dissolved at a concentration of 4 wt % in cyclohexanone was prepared. A glass substrate coated with ITO was washed sequentially with water and isopropanol, and then the mixed solution was spin-coated onto an ITO-deposited base material at 1,000 rpm for 30 seconds. The obtained thin film was subjected to heat treatment under an oxygen atmosphere at 220° C. for 15 minutes, thereby forming a hole injection layer having a very uniform thickness of 30 nm.

A solution in which the following compound HT-1 was dissolved in toluene was spin-coated on the top of the hole injection layer, thereby forming a hole transporting layer.

An electron blocking layer was formed to have a thickness of 15 nm on the top of the hole transporting layer. BH of the following chemical formula being a blue fluorescent host was doped with BD being a blue dopant at a weight ratio of 95:5 on the electron blocking layer, thereby forming a light emitting layer having a thickness of 30 nm.

BH

BD

ET 201

LiQ

HT-1

Subsequently, an electron transporting layer ET 201 and LIQ were simultaneously deposited at a weight ratio of 1:1 on the top of the light emitting layer, thereby forming an electron transporting layer having a thickness of 20 nm.

Finally, Al was deposited to have a thickness of 80 nm on the electron transporting layer, thereby manufacturing an organic electroluminescent device. Characteristics of the device are shown in Table 2.

Example 8

A device was manufactured in the same manner as in Example 7, except that NaNO₃ and MoO₂(acac)₂ at a weight ratio of 2:98 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing prepare a hole injection layer. At this time, the thickness of the hole injection layer was 30 nm. Characteristics of the device are shown in Table 2.

Example 9

A device was manufactured in the same manner as in Example 7, except that $NaNO_3$ and $MoO_2(acac)_2$ at a weight ratio of 5:95 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Example 10

A device was manufactured in the same manner as in Example 7, except that $Cs_2CO_2$ and $MoO_2(acac)_2$ at a weight ratio of 2:98 were dissolved at a concentration of 4 wt % in ethylene glycol monomethyl ether, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Example 11

A device was manufactured in the same manner as in Example 7, except that $Zn(acac)_2$ and $MoO_2(acac)_2$ at a weight ratio of 10:90 were dissolved at a concentration of 4 wt % in ethylene glycol monomethyl ether, the resulting solution was coated at 700 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Example 12

A device was manufactured in the same manner as in Example 7, except that $Zn(acac)_2$ and $MoO_2(acac)_2$ at a weight ratio of 5:95 were dissolved at a concentration of 4 wt % in ethylene glycol monomethyl ether, the resulting solution was coated at 700 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Example 13

A device was manufactured in the same manner as in Example 7, except that $Ru(acac)_2$ and $MoO_2(acac)_2$ at a weight ratio of 5:95 were dissolved at a concentration of 4 wt % in ethylene glycol monomethyl ether, the resulting solution was coated at 700 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 3

A device was manufactured in the same manner as in Example 7, except that a hole injection layer was prepared to have a thickness of 40 nm by depositing $MoO_3$. Characteristics of the device are shown in Table 2.

Comparative Example 4

A device was manufactured in the same manner as in Example 7, except that $MoO_2(acac)_2$ was dissolved at a concentration of 4 wt % in cyclohexanone, the resulting solution was coated at 1,000 rpm on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 5

A device was manufactured in the same manner as in Example 7, except that titanium isopropoxide and $MoO_2(acac)_2$ were mixed at a weight ratio of 5:95 and dissolved at a concentration of 4 wt % in methyl ethyl ketone, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 6

A device was manufactured in the same manner as in Example 7, except that $Zr(acac)_2$ and $MoO_2(acac)_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 7

A device was manufactured in the same manner as in Example 7, except that $Ga(acac)_2$ and $MoO_2(acac)_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 8

A device was manufactured in the same manner as in Example 7, except that $In(acac)_2$ and $MoO_2(acac)_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 9

A device was manufactured in the same manner as in Example 7, except that $Al(acac)_3$ and $MoO_2(acac)_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 10

A device was manufactured in the same manner as in Example 7, except that Sn(acac)$_2$ and MoO$_2$(acac)$_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 11

A device was manufactured in the same manner as in Example 7, except that cobalt acetylacetonate and MoO$_2$(acac)$_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 12

A device was manufactured in the same manner as in Example 7, except that Si(EtO)$_4$ (tetraethyl orthosilicate) and MoO$_2$(acac)$_2$ were mixed at a weight ratio of 10:90 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

Comparative Example 13

A device was manufactured in the same manner as in Example 7, except that Ni(acac)$_2$ and MoO$_2$(acac)$_2$ were mixed at a weight ratio of 5:95 and dissolved at a concentration of 4 wt % in ethylene glycol monomethyl ether, the resulting solution was coated on an ITO-deposited base material, and then a heat treatment was carried out under an oxygen atmosphere, thereby preparing a hole injection layer. At this time, the thickness of the hole injection layer was 30 nm. Characteristics of the device are shown in Table 2.

The voltage, efficiency, and service life (LT80) characteristics of the devices manufactured in the above-described Examples 7 to 13 and Comparative Examples 3 and 13 were measured under a condition of 10 mA/cm$^2$, and the measurement results are shown in the following Table 2.

TABLE 2

| | Complex to be mixed | Voltage | Efficiency (EQE) | LT80 |
|---|---|---|---|---|
| Example 7 | Cu(II)-acetate | 4.42 | 5.39 | 45 |
| Example 8 | NaNO$_3$ | 4.44 | 4.86 | 54 |
| Example 9 | NaNO$_3$ | 4.75 | 5.10 | 98 |
| Example 10 | Cs$_2$CO$_3$ | 4.77 | 4.78 | 50 |
| Example 11 | Zn(II)-acetylacetonate | 4.56 | 4.33 | 80 |
| Example 12 | Zn(II)-acetylacetonate | 4.53 | 4.89 | 65 |
| Example 13 | Ru(acac)$_2$ | 4.47 | 4.87 | 48 |
| Comparative Example 3 | — | 10 | 1.53 | 2 |
| Comparative Example 4 | — | 4.43 | 4.94 | 30 |
| Comparative Example 5 | Ti(IV)-isopropoxide | 4.43 | 4.89 | 15 |
| Comparative Example 6 | Zr(IV)-acetylacetonate | 4.55 | 5.01 | 10 |
| Comparative Example 7 | Ga(III)-acetylacetonate | 4.97 | 5.65 | 30 |
| Comparative Example 8 | In(III)-acetylacetonate | 4.45 | 5.25 | 31 |
| Comparative Example 9 | Al-acetylacetonate | 4.50 | 4.70 | 23 |
| Comparative Example 10 | Sn(II)-acetylacetonate | 4.44 | 4.79 | 32 |
| Comparative Example 11 | Co(II)-acetylacetonate | 4.56 | 4.79 | 28 |
| Comparative Example 12 | Si(EtO)$_4$ | 7.49 | 5.15 | 8 |
| Comparative Example 13 | Ni(acac)$_2$ | 4.78 | 4.94 | 19 |

As shown in Table 2, it could be confirmed that a device of Comparative Example 4, which was formed by forming a hole injection layer by means of a solution process and carrying out a heat treatment at 220° C. exhibited low driving voltage characteristics even at a thickness of 30 nm or more as compared to a device of Comparative Example 3 having a hole injection layer formed by depositing MoO$_3$, and it could be confirmed that the devices of Examples 7 to 13, in which doping with the other elements was performed had more improved service life characteristics than the device of Comparative Example 4.

It could be confirmed that the case where a transition metal such as Mo, W, and V was doped with Group I, Group VIII, Group XI, or Group XII elements had excellent service life characteristics as compared to the case where the transition metal was doped with metal elements belonging to the other groups.

The invention claimed is:

1. A coating composition for a hole injection or transporting layer or a charge generating layer of an organic electroluminescent device, the coating composition comprising:
    an organic metal complex comprising one or more of Group V, Group VI, or Group VII transition metals;
    a metal salt comprising acetate, nitrate, or sulfate, and comprising one or more of Ru, Os, Ag, Au, Zn, or Cd; and
    an organic solvent,
    wherein the organic metal complex comprising one or more of Group V, Group VI, or Group VII transition metals is a structure in which the one or more of Group V, Group VI, or Group VII transition metals are bonded to an organic ligand, and the organic ligand is acetylacetonate, ethylacetoacetate, methylacetoacetate, OPh, carbonyl, methoxy, ethoxy, propoxy, isopropoxy, butoxy, sec-butoxy, tert-butoxy, pentoxy, hexyloxy, heptyloxy, octyloxy, or ethylhexyloxy, and an atomic ratio of the one or more of Group V, Group VI, or Group VII transition metals among the total metal atoms in the coating composition is 50 at % to 99.9 at %.

2. The coating composition of claim 1, wherein the organic metal complex comprising one or more of Group V, Group VI, or Group VII transition metals comprises Mo, W, V, or Re.

3. The coating composition of claim 1, wherein the organic solvent is an alcohol-based solvent or a ketone-based solvent.

4. The coating composition of claim 1, wherein the organic solvent comprises a solvent represented by the following General Formula 1:

[General Formula 1]

wherein, n is an integer from 1 to 20, 1 and m are each independently an integer from 0 to 5, and $R_1$, $R_2$, $R_3$ and $R_4$ are each independently a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 carbon atoms, a heteroaryl group having 2 to 40 carbon atoms, or an ester group having 1 to 20 carbon atoms.

5. The coating composition of claim 1, wherein the organic solvent comprises at least one of ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2-propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, or triethylene glycol.

6. A method for manufacturing an organic electroluminescent device, the method comprising:
preparing a substrate;
forming a first electrode on the substrate;
forming an organic material layer having one or more layers on the first electrode; and
forming a second electrode on the organic material layer,
wherein the method further comprises forming a hole injection or transporting layer or a charge generating layer by a coating method using the coating composition according to claim 1, wherein the hole injection or transporting layer or the charge generating layer is disposed between the first electrode and the organic material layer, between the second electrode and the organic material layer, or when the organic material layer has two or more layers, between the two or more layers.

7. The method of claim 6, wherein the hole injection or transporting layer or the charge generating layer formed by using the coating composition has a thickness of 1 nm to 1,000 nm.

8. The method of claim 6, further comprising:
annealing the hole injection or transporting layer or the charge generating layer, after forming the hole injection or transporting layer or the charge generating layer by using the coating composition.

9. The method of claim 8, wherein the annealing is carried out at a temperature of 150° C. to 250° C.

10. An organic electroluminescent device comprising:
a first electrode;
a second electrode; and
an organic material layer having one or more layers disposed between the first electrode and the second electrode,
wherein the organic electroluminescent device further comprises a hole injection or transporting layer or a charge generating layer which is disposed between the first electrode and the organic material layer, between the second electrode and the organic material layer, or when the organic material layers has two or more layers disposed between the first electrode and the second electrode, between the two or more layers, and is composed of a metal oxide comprising one or more transition metals selected from Mo, W, or Re, and one or more metals selected from Cd, or Au,
and
wherein an atomic ratio of the one or more transition metals selected from Mo, W, or Re among the total metal atoms in the hole injection or transporting layer or the charge generating layer is 50 at % to 99.9 at %.

11. An organic electroluminescent device comprising:
a first electrode;
a second electrode; and
an organic material layer having one or more layers disposed between the first electrode and the second electrode,
wherein the organic electroluminescent device further comprises a hole injection or transporting layer or a charge generating layer which is disposed between the first electrode and the organic material layer, between the second electrode and the organic material layer, or when the organic material layer has two or more layers disposed between the first electrode and the second electrode, between the two or more layers, and is formed by using the coating composition according to claim 1.

12. The organic electroluminescent device of claim 10, wherein the hole injection or transporting layer or the charge generating layer has a thickness of 1 nm to 1,000 nm.

13. The organic electroluminescent device of claim 10, wherein the hole injection or transporting layer or the charge generating layer is annealed.

14. The organic electroluminescent device of claim 10, wherein the hole injection or transporting layer or the charge generating layer is composed of M1xM2yOz, wherein M1 is the one or more transition metals selected from Mo, W, or Re, M2 is the one or more metals selected from Group I metals, Cd, or Au, $0<x+y\leq100$, $0<z\leq400$, $50\leq x\leq99.99$, and $0.01\leq y\leq50$.

15. The organic electroluminescent device of claim 10, wherein the metal oxide comprises a M-O bond and optionally a M-M bond, or forms a M-O—X bond with an interface with the first electrode or the second electrode with which the hole injection or transporting layer or the charge generating layer is brought into contact, wherein M is the one or more transition metals selected from Mo, W, or Re, and X is one of elements constituting the first electrode or the second electrode with which the hole injection or transporting layer or the charge generating layer is brought into contact.

16. The coating composition of claim 1, wherein the metal salt comprises silver nitrate.

* * * * *